United States Patent
Chao

(10) Patent No.: US 8,237,158 B2
(45) Date of Patent: Aug. 7, 2012

(54) ORGANIC ELECTROLUMINESCENCE DEVICE AND METHOD OF MANUFACTURING THE SAME

(75) Inventor: Ching-Yan Chao, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 13/023,484

(22) Filed: Feb. 8, 2011

(65) Prior Publication Data

US 2012/0126263 A1 May 24, 2012

(30) Foreign Application Priority Data

Nov. 19, 2010 (TW) .............................. 99140004 A

(51) Int. Cl.
*H01L 29/08* (2006.01)
(52) U.S. Cl. ............ 257/40; 257/98; 257/103; 313/503; 313/506
(58) Field of Classification Search ............... 257/40, 257/98, 103; 313/503, 504, 506
See application file for complete search history.

(56) References Cited

U.S. PATENT DOCUMENTS

| | | | |
|---|---|---|---|
| 6,703,780 B2 * | 3/2004 | Shiang et al. | 313/504 |
| 6,933,522 B2 * | 8/2005 | Lin et al. | 257/40 |
| 7,259,513 B2 | 8/2007 | Suh et al. | |
| 2005/0184653 A1 | 8/2005 | Suh et al. | |

FOREIGN PATENT DOCUMENTS

| | | |
|---|---|---|
| CN | 1658721 | 8/2005 |
| TW | I236309 | 7/2005 |
| TW | I273218 | 2/2007 |

\* cited by examiner

*Primary Examiner* — Howard Weiss
*Assistant Examiner* — Steven Rao
(74) *Attorney, Agent, or Firm* — Jianq Chyun IP Office

(57) ABSTRACT

An organic electroluminescence device and a method of manufacturing the same are provided. The organic electroluminescence device is suitable for being configured on a substrate. The organic electroluminescence device includes a first electrode, a first doped carrier transporting layer, a light-emitting layer, a second doped carrier transporting layer, and a second electrode. The first electrode is configured on the substrate. The first doped carrier transporting layer is configured on the first electrode. The light-emitting layer is configured on the first doped carrier transporting layer. The second doped carrier transporting layer is configured on the light-emitting layer and has a first surface in contact with the light-emitting layer and a second surface opposite to the first surface. The first surface is substantially a planar surface, and the second surface is a rough surface having a plurality of micro-protrusions. The second electrode is configured on the second surface.

17 Claims, 5 Drawing Sheets

ORGANIC ELECTROLUMINESCENCE DEVICE AND METHOD OF MANUFACTURING THE SAME

CROSS-REFERENCE TO RELATED APPLICATION

This application claims the priority benefit of Taiwan application serial no. 99140004, filed on Nov. 19, 2010. The entirety of the above-mentioned patent application is hereby incorporated by reference herein and made a part of this specification.

BACKGROUND OF THE INVENTION

1. Field of the Invention

The invention relates to a device. More particularly, the invention relates to an organic electroluminescence device and a method of manufacturing the same.

2. Description of Related Art

An organic electroluminescence device is an optoelectronic device capable of efficiently converting electric energy into light, and the organic electroluminescence device often serves as an illumination source, a display panel, and so forth. Since the organic electroluminescence device is characterized by wide viewing angle, simple fabrication, low costs, high response speed, wide operating temperature range, and full-color display, the organic electroluminescence device satisfying the requirement for the multi-media display has become a popular research topic in recent years.

FIG. 1 is a schematic view illustrating a conventional organic electroluminescence device. With reference to FIG. 1, the organic electroluminescence device 100 includes a substrate 110, a first electrode 120, a hole injection layer 130, a hole transporting layer 140, an organic light-emitting layer 150, an electron transporting layer 160, an electron injection layer 170, and a second electrode 180. In general, the first electrode 120, the hole injection layer 130, the hole transporting layer 140, the organic light-emitting layer 150, the electron transporting layer 160, the electron injection layer 170, and the second electrode 180 are sequentially stacked onto the substrate 110. Besides, the second electrode 180 is made of metallic materials with excellent reflectivity, such that light emitted from the organic light-emitting layer 150 is reflected for the purpose of display.

The second electrode 180, in most cases, is a flat electrode layer that can provide a reflection function. Moreover, the air, the substrate 110, the first electrode 120, the hole injection layer 130, the hole transporting layer 140, the organic light-emitting layer 150, the electron transporting layer 160, and the electron injection layer 170 have different refractive indexes, such that the light whose incident angle is greater than critical angle leads to total reflection among interfaces of different layers. Owing to the reflection of the second electrode 180 and the total reflection among the interfaces, the light emitted from the organic light-emitting layer 150 and having the incident angle greater than critical angle will be trapped in between substrate 110 and the second electrode 180. Under said design, approximately 20% of the light emitted from the organic light-emitting layer 150 can pass through the substrate 110, thus resulting in a low external efficiency of the organic electroluminescence device 100.

SUMMARY OF THE INVENTION

The invention is related to an organic electroluminescence device that has the high external efficiency, the reduced power consumption, and the improved quality.

The invention is further related to a method of manufacturing an organic electroluminescence device. By applying the method, a rough and uneven reflective electrode is fabricated to achieve the effect of diffusive reflection.

The invention provides an organic electroluminescence device suitable for being configured on a substrate. The organic electroluminescence device includes a first electrode, a first doped carrier transporting layer, a light-emitting layer, a second doped carrier transporting layer, and a second electrode. The first electrode is configured on the substrate. The first doped carrier transporting layer is configured on the first electrode. The light-emitting layer is configured on the first doped carrier transporting layer. The second doped carrier transporting layer is configured on the light-emitting layer and has a first surface in contact with the light-emitting layer and a second surface opposite to the first surface. The first surface is substantially a planar surface, and the second surface is a rough surface. The second electrode is configured on the second surface.

The invention further provides a method of manufacturing an organic electroluminescence device. In the method, a first electrode is formed on a substrate. A first doped carrier transporting layer is formed on the first electrode. A light-emitting layer is formed on the first doped carrier transporting layer. A second doped carrier transporting layer is formed on the light-emitting layer. The second doped carrier transporting layer has a first surface and a second surface. The first surface is in contact with the light-emitting layer, and the second surface is opposite to the first surface. Here, the first surface is substantially a planar surface, and the second surface is a rough surface. A second electrode is formed on the second surface.

The invention further provides an organic electroluminescence device suitable for being configured on a substrate. The organic electroluminescence device includes a first electrode, a first doped carrier transporting layer, a light-emitting layer, a second doped carrier transporting layer, and a second electrode. The first electrode is configured on the substrate. The first doped carrier transporting layer is configured on the first electrode. Here, the first doped carrier transporting layer has a first surface and a second surface. The first surface is in contact with the first electrode, and the second surface is opposite to the first surface. The first surface is substantially a planar surface, and the second surface is a rough surface. The light-emitting layer is configured on the first doped carrier transporting layer. The second doped carrier transporting layer is configured on the light-emitting layer. The second electrode is configured on the second doped carrier transporting layer.

Based on the above, a thermal annealing process or a thermal evaporation process is performed to form a plurality of micro-protrusions on a surface of the second doped carrier transporting layer of the organic electroluminescence device in this invention, and the second electrode is configured on the micro-protrusions. The design of the second electrode and the micro-protrusions can accomplish the effect of diffusive reflection. As such, the organic electroluminescence device can have a favorable external efficiency.

In order to make the aforementioned and other features and advantages of the invention more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 2A:
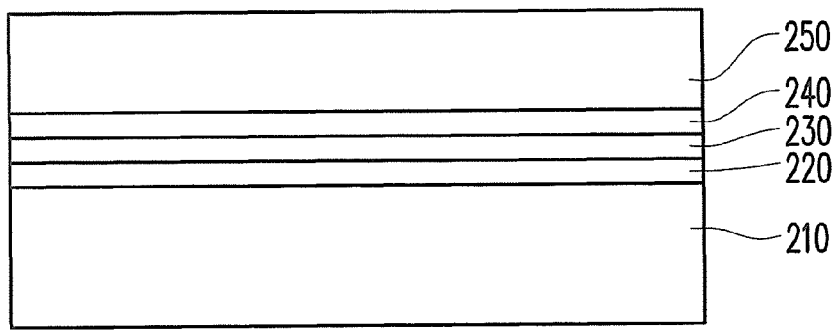
FIG. 2A to FIG. 2C illustrate a method of manufacturing an organic electroluminescence device according to the first embodiment of the invention.
Figure 2B:
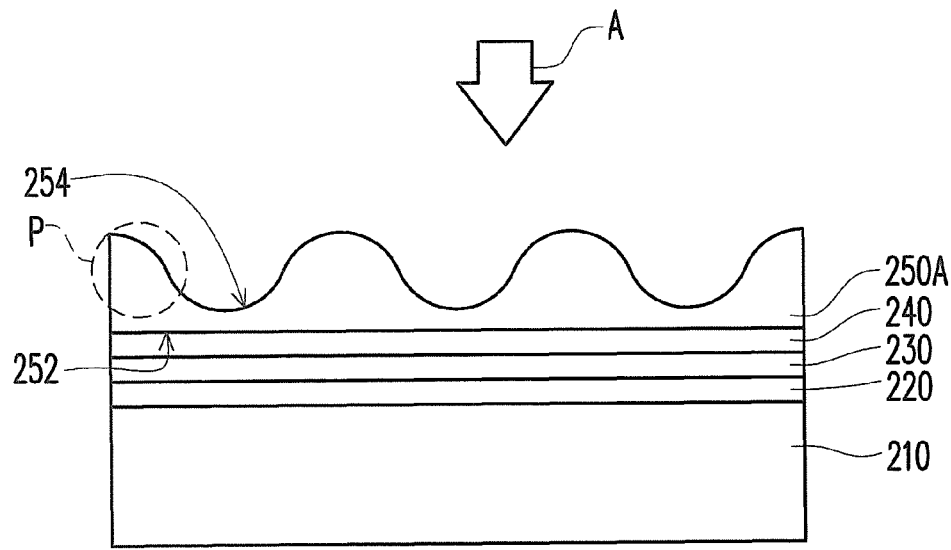
Figure 2C:
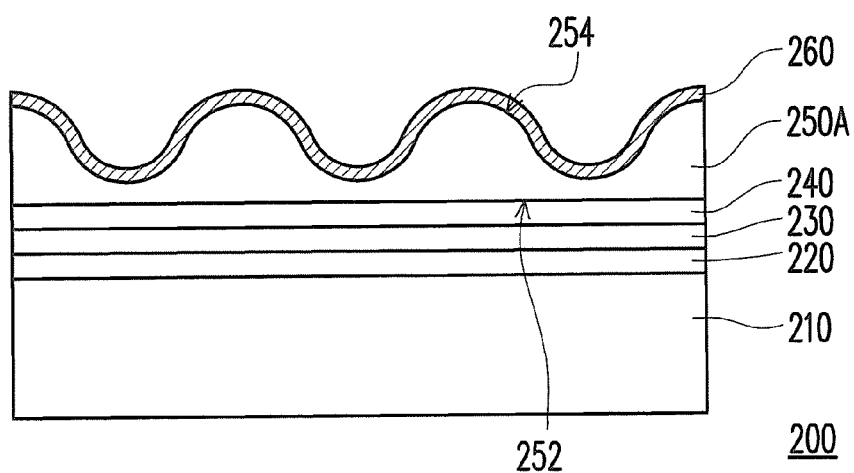

FIG. 2A to FIG. 2C illustrate a method of manufacturing an organic electroluminescence device according to the first embodiment of the invention. With reference to FIG. 2A, a first electrode 220, a first doped carrier transporting layer 230, a light-emitting layer 240, and a second doped carrier transporting layer 250 are sequentially formed on a substrate 210. Namely, the first electrode 220 is configured on the substrate 210. The first doped carrier transporting layer 230 is configured on the first electrode 220. The light-emitting layer 240 is configured on the first doped carrier transporting layer 230. The second doped carrier transporting layer 250 is configured on the light-emitting layer 240. In this embodiment, a thickness of the second doped carrier transporting layer 250 ranges from about 0.2 μm to about 2 μm, for instance. Preferably, the thickness of the second doped carrier transporting layer 250 ranges from about 0.5 μm to about 1 μm.

With reference to FIG. 2A and FIG. 2B, a thermal annealing process A is performed on the second doped carrier transporting layer 250 shown in FIG. 2A. Here, the temperature at which the thermal annealing process A is performed ranges from about 50° C. to about 120° C., for instance.

According to this embodiment, a glass transition temperature (Tg) of the second doped carrier transporting layer 250A on which the thermal annealing process A is performed ranges from about 30° C. to about 100° C., preferably from about 40° C. to about 70° C. After the thermal annealing process A is performed, the second doped carrier transporting layer 250A has a first surface 252 and a second surface 254. The first surface 252 is in contact with the light-emitting layer 240, and the second surface 254 is opposite to the first surface 252. Here, the first surface 252 is substantially a planar surface, and the second surface 254 is a rough surface having a plurality of micro-protrusions P. It should be mentioned that interfaces between elements of the structure shown in FIG. 2B are planar surfaces except for the second surface 254. Therefore, the connecting correlations among the components in the device are basically not affected by the thermal annealing process A. In addition, the second doped carrier transporting layer 250A of this embodiment has a certain thickness, and the surface roughness Ra of the second surface 254 of the second doped carrier transporting layer 250A reaches about 30 nm~200 nm after the thermal annealing process A is performed.

Figure 1:
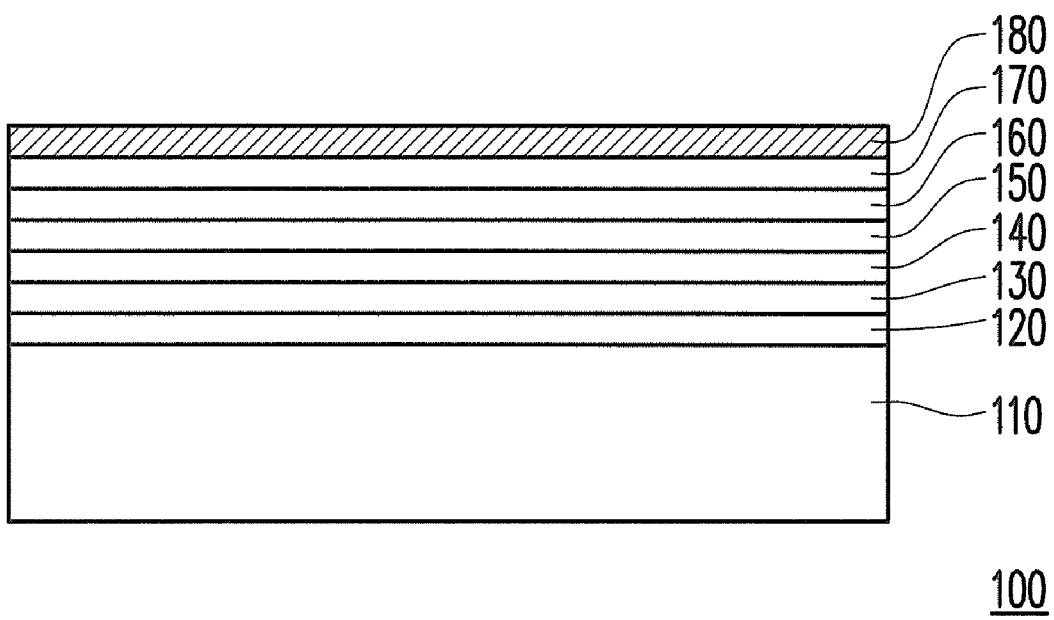
FIG. 1 is a schematic view illustrating a conventional organic electroluminescence device.

With reference to FIG. 2C, a second electrode 260 is formed on the second surface 254 of the second doped carrier transporting layer 250A. The first electrode 220, the first doped carrier transporting layer 230, the light-emitting layer 240, the second doped carrier transporting layer 250A, and the second electrode 260 together form the organic electroluminescence device 200 that is configured on the substrate 210. In this embodiment, the first electrode 220 is a transparent electrode, for instance, and the second electrode 260 is a reflective electrode, for instance. In addition, the second electrode 260 substantially conforms to the second surface 254. Besides, the second electrode 260, together with the micro-protrusions P, has a micro-protrusion profile. Thereby, after the light emitted from the light-emitting layer 240 irradiates the second electrode 260, the light undergoes diffusive reflection and is reflected in different directions. Compared with the planar second electrode 180 in a conventional organic electroluminescence device (shown in FIG. 1), the waveguide effect is largely reduced in FIG. 2C, most of the light emitted from the light-emitting layer 240 can be further emitted from the substrate 210, so as to improve the external efficiency of the organic electroluminescence device 200.

In this embodiment, the first doped carrier transporting layer 230 can be a hole transporting layer, and the second doped carrier transporting layer 250A can be an electron transporting layer. However, along with adjustment of the device structure and changes of film characteristics, the first doped carrier transporting layer 230 can be an electron transporting layer, and the second doped carrier transporting layer 250A can be a hole transporting layer according to other embodiments of the invention. Additionally, the first doped carrier transporting layer 230 and the second doped carrier transporting layer 250A can have the single-layered structure or the multi-layered structure.

Figure 3A:
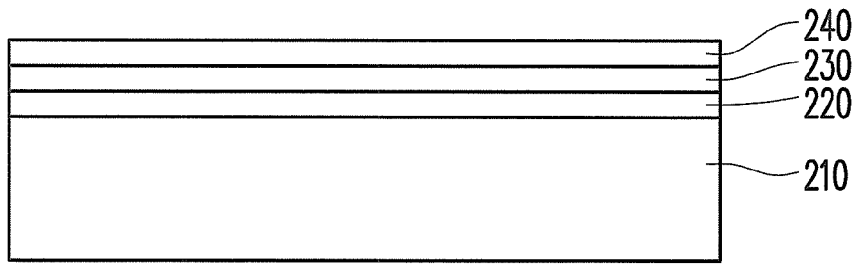
FIG. 3A to FIG. 3C illustrate a method of manufacturing an organic electroluminescence device according to the second embodiment of the invention.
Figure 3B:
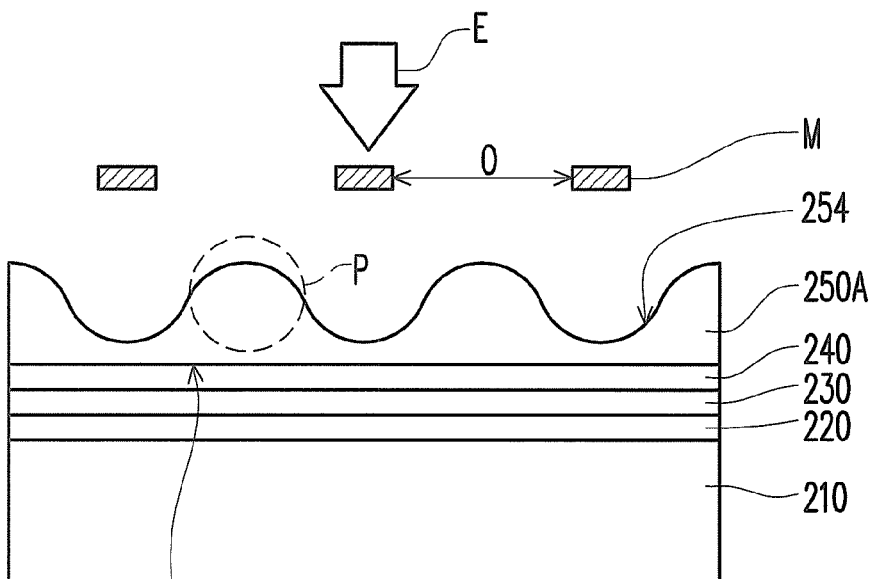
Figure 3C:
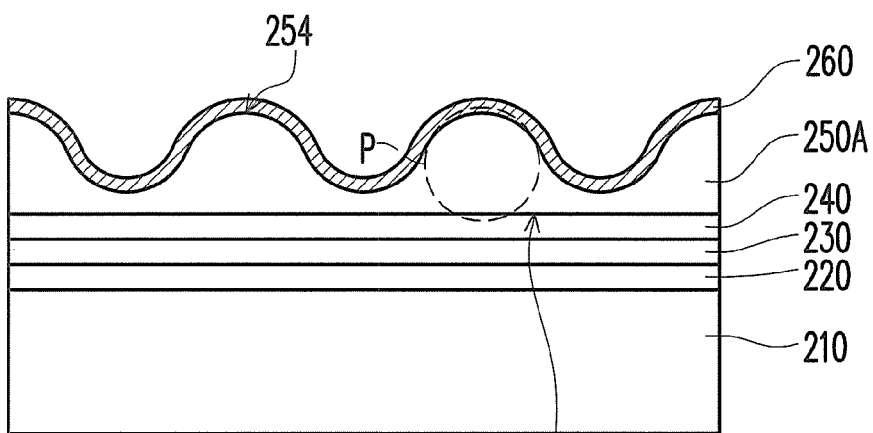

Certainly, the method of manufacturing the organic electroluminescence device 200 is not limited to that described in the previous embodiment. FIG. 3A to FIG. 3C illustrate a method of manufacturing an organic electroluminescence device according to the second embodiment of the invention. With reference to FIG. 3A and FIG. 3B, after the light-emitting layer 240 is formed, as shown in FIG. 3A, a thermal evaporation process E is performed on the second doped carrier transporting layer 250 with use of a shadow mask M as a mask in this embodiment, for instance, so as to form the second doped carrier transporting layer 250A having the micro-protrusions P. The second electrode 260 is then formed on the second doped carrier transporting layer 250A, and the organic electroluminescence device 200 depicted in FIG. 3C is completely formed. According to this embodiment, the second electrode 260 is a reflective electrode, which is not limited in this invention. In other words, the thermal evaporation process E of this embodiment replaces the thermal annealing process A depicted in FIG. 2B.

To be more specific, the shadow mask M of this embodiment has a plurality of openings O, and a distance between every two of the openings O ranges from about 10 μm to about 30 μm, for instance. When the thermal evaporation process E is performed with use of the shadow mask M as the mask, a portion of the second doped carrier transporting layer 250A corresponding to the openings O has a relatively large thickness, while the other portion covered by the shadow mask M has a relatively small thickness, so as to form the micro-protrusions P. Accordingly, the second doped carrier transporting layer 250A has a substantially planar first surface 252 and a rough second surface 254, and the second electrode 260 configured on the second surface 254 as shown in FIG. 3C can achieve the effect of diffusive reflection, such that the external efficiency of the organic electroluminescence device 200 can be improved.

Figure 4A:
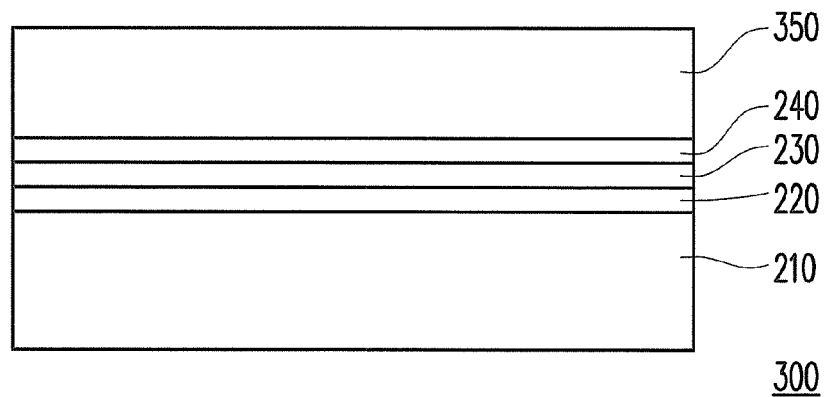
FIG. 4A to FIG. 4C illustrate a method of manufacturing an organic electroluminescence device according to the third embodiment of the invention.
Figure 4B:
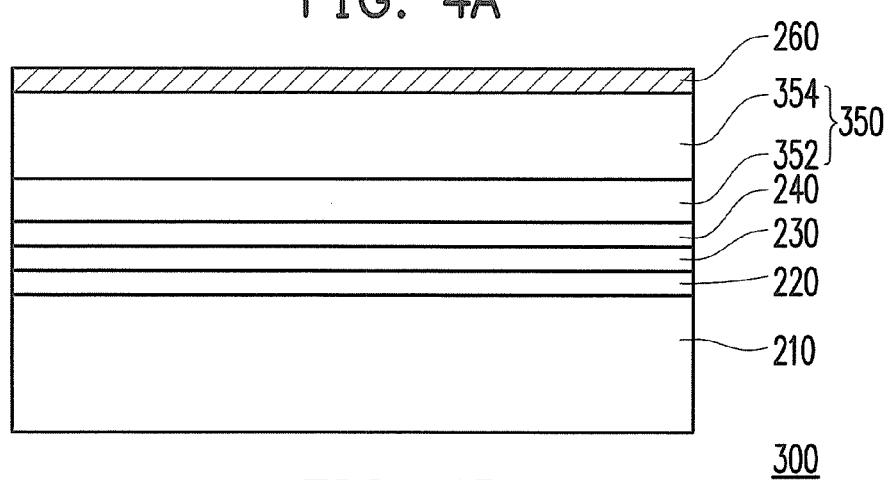
Figure 4C:
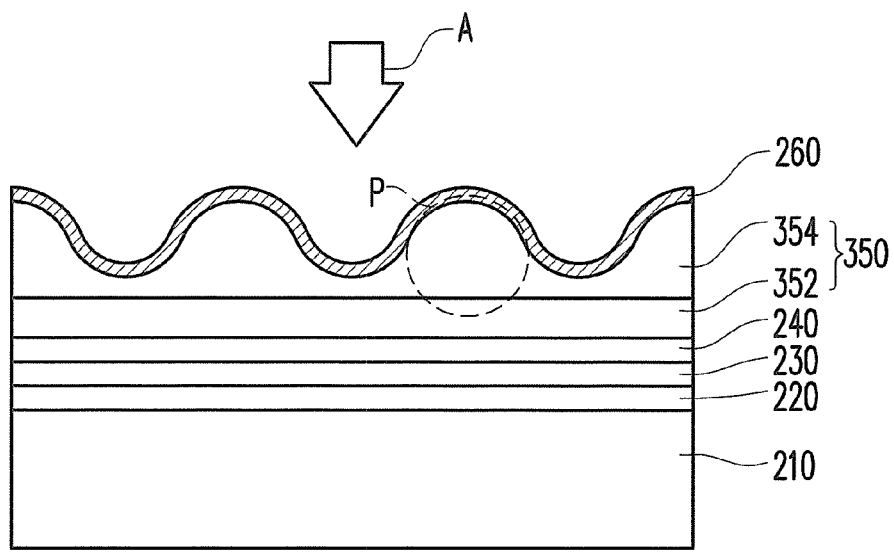

FIG. 4A to FIG. 4C illustrate a method of manufacturing an organic electroluminescence device according to the third embodiment of the invention. With reference to FIG. 4A to FIG. 4C, the organic electroluminescence device 300 is suitable for being configured on the substrate 210. The organic electroluminescence device 300 includes the first electrode 220, the first doped carrier transporting layer 230, the light-emitting layer 240, a second doped carrier transporting layer 350, and the second electrode 260 that are sequentially stacked onto the substrate 210. The second doped carrier transporting layer 350 of this embodiment can include a first thin film 352 and a second thin film 354. The first thin film 352 is configured on the light-emitting layer 240. The second thin film 354 is configured between the first thin film 352 and the second electrode 260. According to other embodiments of the invention, the second doped carrier transporting layer 350 can merely have the second thin film 354 of which a glass transition temperature (Tg) ranges from about 30° C. to about 100° C., preferably from about 40° C. to about 70° C. That is to say, whether the second doped carrier transporting layer 350 has the single-layered structure or the multi-layered structure is not limited in this invention.

Note that when the second doped carrier transporting layer 350 includes the first thin film 352 and the second thin film 354, the glass transition temperature of the first thin film 352 is higher than that of the second thin film 352, and the glass transition temperature of the second thin film 352 ranges from 30° C. to about 100° C., preferably from about 40° C. to about 70° C., for instance. In an embodiment of the invention, the second doped carrier transporting layer 350 can merely have the second thin film 354 that has a relatively low glass transition temperature. The main difference between the previous embodiment and this embodiment lies in that the thermal annealing process A is performed after the second electrode 260 is completely formed. Namely, the method of manufacturing the second doped carrier transporting layer 350 includes sequentially forming the first thin film 352, the second thin film 354, and the second electrode 260 and performing the thermal annealing process A, such that the second thin film 354 can have a plurality of micro-protrusions P. In other words, a side of the second doped carrier transporting layer 350 close to the light-emitting layer 240 has a planar surface, while the other side of the second doped carrier transporting layer 350 away from the light-emitting layer 240 has a rough surface. As such, the second electrode 260 configured on the second thin film 354 can accomplish the effect of diffusive reflection, so as to improve the external efficiency of the organic electroluminescence device 300. In an embodiment of the invention, the second doped carrier transporting layer 350 can be an electron transporting layer and can include the first thin film 352 and the second thin film 354; the second thin film 354 can be an n-type doped electron transporting layer. In another embodiment of the invention, the second doped carrier transporting layer 350 can be a hole transporting layer and can include the first thin film 352 and the second thin film 354; the second thin film 354 can be a p-type doped hole transporting layer.

In this embodiment, the first doped carrier transporting layer 230 can be a hole transporting layer, and the second doped carrier transporting layer 350 can be an electron transporting layer. In another embodiment of the invention, the second doped carrier transporting layer 350 can be an n-type doped electron transporting layer. However, along with adjustment of the device structure and changes of film characteristics, the first doped carrier transporting layer 230 can be an electron transporting layer, and the second doped carrier transporting layer 350 can be a hole transporting layer according to other embodiments of the invention. In another embodiment of the invention, the second doped carrier transporting layer 350 can be a p-type doped hole transporting layer. Additionally, the first doped carrier transporting layer 230 and the second doped carrier transporting layer 350 can have the single-layered structure or the multi-layered structure.

Figure 5:
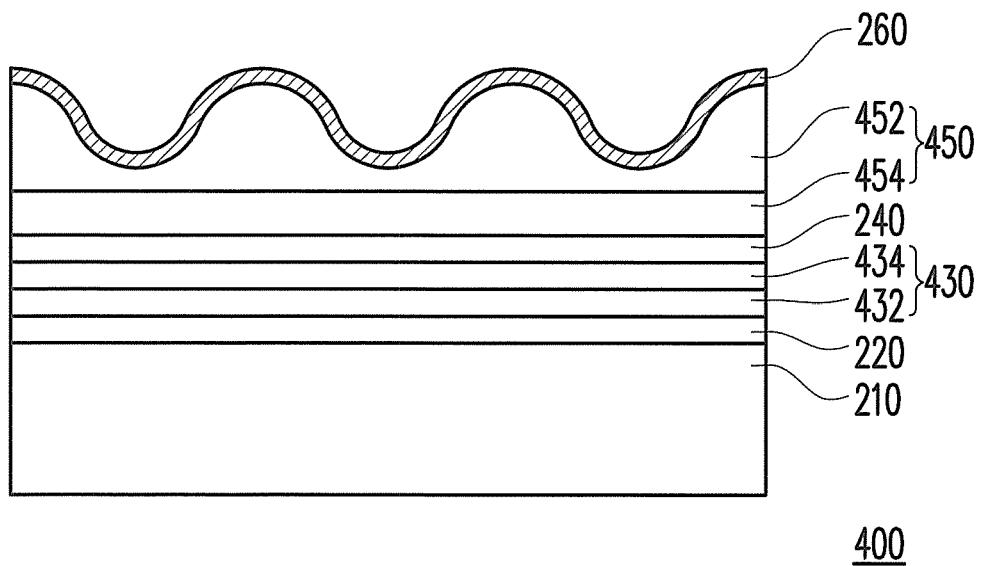
FIG. 5 is a schematic view illustrating an organic electroluminescence device according to the fourth embodiment of the invention.

FIG. 5 is a schematic view illustrating an organic electroluminescence device according to the fourth embodiment of the invention. With reference to FIG. 5, the organic electroluminescence device 400 is suitable for being configured on the substrate 210. The organic electroluminescence device 400 includes the first electrode 220, a first doped carrier transporting layer 430, the light-emitting layer 240, a second doped carrier transporting layer 450, and the second electrode 260 that are sequentially stacked onto the substrate 210. In this embodiment, the first doped carrier transporting layer 430 includes a first carrier injection layer 432 and a first carrier transporting layer 434 that is located between the first carrier injection layer 432 and the light-emitting layer 240. Besides, the second doped carrier transporting layer 450 includes a second carrier injection layer 452 and a second carrier transporting layer 454 that is located between the second carrier injection layer 452 and the light-emitting layer 240.

Particularly, the first carrier injection layer 432 and the first carrier transporting layer 434 can be a hole injection layer and a hole transporting layer, respectively. Meanwhile, the second carrier injection layer 452 and the second carrier transporting layer 454 can be an electron injection layer and an electron transporting layer, respectively. According to other embodiments of the invention, along with adjustment of the device structure and changes of film characteristics, the first carrier injection layer 432 and the first carrier transporting layer 434 can be an electron injection layer and an electron transporting layer, respectively. Meanwhile, the second carrier injection layer 452 and the second carrier transporting layer 454 can be a hole injection layer and a hole transporting layer, respectively.

In addition to the steps described in the previous embodiments, the method of manufacturing the first doped carrier transporting layer 430 in this embodiment further includes forming a hole injection layer on the first electrode 220 and forming a hole transporting layer on the hole injection layer; the method of manufacturing the second doped carrier transporting layer 450 in this embodiment further includes forming an electron transporting layer on the light-emitting layer 240 and forming an electron injection layer on the electron transporting layer. Alternatively, the method of manufacturing the first doped carrier transporting layer 430 further includes forming an electron injection layer on the first electrode 220 and forming an electron transporting layer on the electron injection layer; the method of manufacturing the second doped carrier transporting layer 450 in this embodiment further includes forming a hole transporting layer on the light-emitting layer 240 and forming a hole injection layer on the hole transporting layer. In other words, as long as one of the first doped carrier transporting layer 430 and the second doped carrier transporting layer 450 transports the electrons, and the other transports the holes, the types of the carriers transported by the first doped carrier transporting layer 430 and the second doped carrier transporting layer 450 are not limited in this embodiment.

Figure 6:
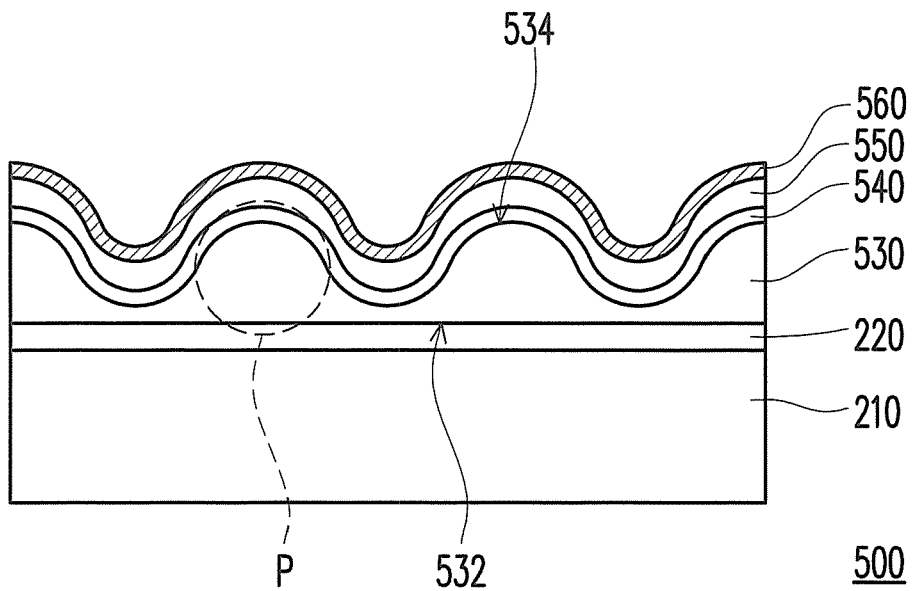
FIG. 6 is a schematic view illustrating an organic electroluminescence device according to the fifth embodiment of the invention.

FIG. 6 is a schematic view illustrating an organic electroluminescence device according to the fifth embodiment of the invention. With reference to FIG. 6, an organic electroluminescence device 500 is suitable for being configured on the substrate 210. The organic electroluminescence device 500 includes the first electrode 220, a first doped carrier transporting layer 530, a light-emitting layer 540, a second doped carrier transporting layer 550, and a second electrode 560. The first electrode 220 is configured on the substrate 210. The first doped carrier transporting layer 530 is configured on the first electrode 220 and has a first surface 532 that is in contact with the first electrode 220 and a second surface 534 that is opposite to the first surface 532. As shown in FIG. 6, the first surface 532 is substantially a planar surface, while the second surface 534 is a rough surface having a plurality of microprotrusions P. The light-emitting layer 540 is configured on the first doped carrier transporting layer 530. The second doped carrier transporting layer 550 is configured on the light-emitting layer 540. The second electrode 560 is configured on the second doped carrier transporting layer 550.

The main difference between the previous embodiment and this embodiment lies in that the first doped carrier transporting layer 530 that is close to the substrate 210 has a planar surface and a rough surface in this embodiment. In addition, the light-emitting layer 540, the second doped carrier transporting layer 550, and the second electrode 560 substantially conform to the rough second surface 534 of the first doped carrier transporting layer 530.

In light of the foregoing, one of the carrier transporting layers in the organic electroluminescence device of the invention has a rough surface on which the reflective electrode is configured. Hence, the reflective electrode of the organic electroluminescence device can accomplish the effect of diffusive reflection. Thereby, the light emitted from the light-emitting layer can be reflected in different directions by the reflective electrode, which leads to the improvement of the external efficiency of the organic electroluminescence device. As a result, the invention is not only applicable to the normal organic electroluminescence device but also applicable to a tandem organic electroluminescence device.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An organic electroluminescence device suitable for being configured on a substrate and comprising:
    a first electrode configured on the substrate;
    a first doped carrier transporting layer configured on the first electrode;
    a light-emitting layer configured on the first doped carrier transporting layer;
    a second doped carrier transporting layer configured on the light-emitting layer and having a first surface and a second surface, the first surface being in contact with the light-emitting layer, the second surface being opposite to the first surface, wherein the first surface is substantially a planar surface, and the second surface is a rough surface; and
    a second electrode configured on the second surface, wherein surface roughness (Ra) of the second surface ranges from about 30 nm to about 200 nm, and a thickness of the second doped carrier transporting layer ranges from about 0.2 µm to about 2 µm.

2. The organic electroluminescence device as claimed in claim 1, wherein the first electrode is a transparent electrode, and the second electrode is a reflective electrode.

3. The organic electroluminescence device as claimed in claim 1, wherein the second surface has a plurality of microprotrusions.

4. The organic electroluminescence device as claimed in claim 1, wherein the first doped carrier transporting layer comprises a hole transporting layer, and the second doped carrier transporting layer comprises an electron transporting layer.

5. The organic electroluminescence device as claimed in claim 1, wherein the first doped carrier transporting layer comprises an electron transporting layer, and the second doped carrier transporting layer comprises a hole transporting layer.

6. The organic electroluminescence device as claimed in claim 1, wherein a thickness of the second doped carrier transporting layer ranges from about 0.5 µm to about 1 µm.

7. The organic electroluminescence device as claimed in claim 1, wherein a glass transition temperature of the second doped carrier transporting layer ranges from about 30° C. to about 100° C.

8. The organic electroluminescence device as claimed in claim 1, wherein a glass transition temperature of the second doped carrier transporting layer ranges from about 40° C. to about 70° C.

9. The organic electroluminescence device as claimed in claim 1, wherein the second doped carrier transporting layer comprises:
    a first thin film configured on the light-emitting layer; and
    a second thin film configured between the first thin film and the second electrode, wherein a glass transition temperature of the first thin film is higher than a glass transition temperature of the second thin film.

10. The organic electroluminescence device as claimed in claim 9, wherein the second thin film comprises an n-type doped layer.

11. The organic electroluminescence device as claimed in claim 9, wherein the second thin film comprises a p-type doped layer.

12. A method of manufacturing an organic electroluminescence device, comprising:
    forming a first electrode on a substrate;
    forming a first doped carrier transporting layer on the first electrode;
    forming a light-emitting layer on the first doped carrier transporting layer;
    forming a second doped carrier transporting layer on the light-emitting layer, the second doped carrier transporting layer having a first surface and a second surface, the first surface being in contact with the light-emitting layer, the second surface being opposite to the first surface, wherein the first surface is substantially a planar surface, and the second surface is a rough surface; and
    forming a second electrode on the second surface, wherein surface roughness (Ra) of the second surface ranges from about 30 nm to about 200 nm, and a thickness of the second doped carrier transporting layer ranges from about 0.2 µm to about 2 µm.

13. The method as claimed in claim 12, wherein a method of forming the rough surface comprises performing a thermal annealing process on the second doped carrier transporting layer.

14. The method as claimed in claim 12, wherein a temperature at which the thermal annealing process is performed ranges from about 50° C. to about 120° C.

15. The method as claimed in claim 12, wherein a method of forming the rough surface comprises performing a thermal evaporation process on the second doped carrier transporting layer with use of a shadow mask.

16. The method as claimed in claim 15, wherein the shadow mask has a plurality of openings, and a distance between every two of the openings ranges from about 10 μm to about 30 μm.

17. An organic electroluminescence device suitable for being configured on a substrate and comprising:
 a first electrode configured on the substrate;
 a first doped carrier transporting layer configured on the first electrode and having a first surface and a second surface, the first surface being in contact with the first electrode, the second surface being opposite to the first surface, wherein the first surface is substantially a planar surface, and the second surface is a rough surface;
 a light-emitting layer configured on the first doped carrier transporting layer;
 a second doped carrier transporting layer configured on the light-emitting layer; and
 a second electrode configured on the second doped carrier transporting layer, wherein surface roughness (Ra) of the second surface ranges from about 30 nm to about 200 nm, and a thickness of the second doped carrier transporting layer ranges from about 0.2 μm to about 2 μm.

* * * * *